United States Patent
Cappelli

(10) Patent No.: US 12,287,585 B2
(45) Date of Patent: Apr. 29, 2025

(54) POLARIZATION SELECTION METROLOGY SYSTEM, LITHOGRAPHIC APPARATUS, AND METHODS THEREOF

(71) Applicant: ASML Holding N.V., Veldhoven (NL)

(72) Inventor: Douglas C. Cappelli, Norwalk, CT (US)

(73) Assignee: ASML Holding N.V., Veldhoven (NL)

( * ) Notice: Subject to any disclaimer, the term of this patent is extended or adjusted under 35 U.S.C. 154(b) by 87 days.

(21) Appl. No.: 18/033,530

(22) PCT Filed: Oct. 14, 2021

(86) PCT No.: PCT/EP2021/078546
§ 371 (c)(1),
(2) Date: Apr. 24, 2023

(87) PCT Pub. No.: WO2022/096249
PCT Pub. Date: May 12, 2022

(65) Prior Publication Data
US 2023/0400782 A1  Dec. 14, 2023

Related U.S. Application Data

(60) Provisional application No. 63/109,803, filed on Nov. 4, 2020.

(51) Int. Cl.
*G03F 7/00* (2006.01)
(52) U.S. Cl.
CPC .. *G03F 7/706849* (2023.05); *G03F 7/706845* (2023.05); *G03F 7/706847* (2023.05)
(58) Field of Classification Search
CPC ........... G03F 7/70633; G03F 7/706845; G03F 7/706847; G03F 7/706849; G03F 7/7085; G03F 9/7065
See application file for complete search history.

(56) References Cited

U.S. PATENT DOCUMENTS 4,725,801 A * 2/1988 Snyder ................ H01H 51/084
  335/125
6,297,876 B1   10/2001 Bornebroek
(Continued)

FOREIGN PATENT DOCUMENTS

| CN | 201303204 Y | 9/2009 |
|---|---|---|
| JP | S56-090521 A | 7/1981 |
| WO | WO 2020/105037 A1 | 5/2020 |

OTHER PUBLICATIONS

International Search Report and Written Opinion of the International Searching Authority directed to International Patent Application No. PCT/EP2021/078546, mailed Feb. 1, 2022; 8 pages.

(Continued)

*Primary Examiner* — Hina F Ayub
(74) *Attorney, Agent, or Firm* — Sterne, Kessler, Goldstein & Fox P.L.L.C.

(57) ABSTRACT

An inspection system, a lithographic apparatus, and a method are provided. The inspection system includes an illumination system, an optical system, a shutter system, an objective system and a detector. The illumination system is configured to generate an illumination beam. The optical system is configured to split the illumination beam into a first sub-beam and a second sub-beam. The shutter system is configured to independently control a transmittance of the first sub-beam and the second subbeam. The objective system is configured to receive the first sub-beam and the second beam from the optical system and direct the first sub-beam and the second sub-beam towards a substrate having a target structure. The detector is configured to receive an image or a diffracted image of the target structure.

10 Claims, 9 Drawing Sheets

(56) References Cited

U.S. PATENT DOCUMENTS

| | | | |
|---|---|---|---|
| 6,961,116 | B2 | 11/2005 | Den Boef et al. |
| 7,408,641 | B1 | 8/2008 | Kwak et al. |
| 7,511,799 | B2 | 3/2009 | Tel et al. |
| 8,706,442 | B2 | 4/2014 | Mos et al. |
| 2012/0168992 | A1 | 7/2012 | Bammer et al. |
| 2016/0025992 | A1 | 1/2016 | Van Der Zouw et al. |
| 2016/0216507 | A1* | 7/2016 | Danehy ............. G03B 17/17 |
| 2016/0313185 | A1* | 10/2016 | Ma ..................... G01J 4/04 |
| 2017/0168312 | A1 | 6/2017 | Kelkar |
| 2019/0155172 | A1 | 5/2019 | Shmarev et al. |
| 2021/0364885 | A1* | 11/2021 | Bauerschmidt ....... G03F 9/7034 |

OTHER PUBLICATIONS

Raymond et al., "Multiparameter grating metrology using optical scatterometry," Journal of Vacuum Science & Technology B: Microelectronics and Nanometer Structures Processing, Measurement, and Phenomena, vol. 15, Mar. 1, 1997; pp. 361-368.

Niu et al., "Specular Spectroscopic Scatterometry in DUV Lithography," Proc. SPIE, Metrology, Inspection, and Process Control for Microlithography XIII, vol. 3677, Jun. 14, 1999; 10 pages.

* cited by examiner

POLARIZATION SELECTION METROLOGY SYSTEM, LITHOGRAPHIC APPARATUS, AND METHODS THEREOF

CROSS-REFERENCE TO RELATED APPLICATIONS

This application claims priority of U.S. Provisional Patent Application No. 63/109,803, which was filed on Nov. 4, 2020, and which is incorporated herein in its entirety by reference.

FIELD

The present disclosure relates to lithographic systems, for example, inspection systems including a polarizing prism assembly in a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

Metrology systems and sensors illuminate the substrate with light having H-polarization, V-polarization, H and V-polarization, or no light. One of the critical parameters for sensor performance is the polarization purity of the light hitting the substrate from the illumination system.

SUMMARY

There is a need to provide inspection systems having improved polarization state.

In some embodiments, an inspection system includes an illumination system, an optical system, a shutter system, an objective system and a detector. The illumination system is configured to generate an illumination beam. The optical system is configured to split the illumination beam into a first sub-beam and a second sub-beam. The shutter system is configured to independently control a transmittance of the first sub-beam and the second sub-beam. The objective system is configured to receive the first sub-beam and the second beam from the optical system and direct the first sub-beam and the second sub-beam towards a substrate having a target structure. The detector is configured to receive an image or a diffracted image of the target structure.

In some embodiments, a method includes splitting, via an optical system, an illumination beam into a first sub-beam and a second sub-beam, independently controlling, via a shutter system, a transmittance of the first sub-beam or the second sub-beam, directing, via an objective projection system, a portion of the transmitted first sub-beam and the second sub-beam towards a substrate having a target structure, and detecting an image or diffracted image of the target structure.

In some embodiments, a lithographic apparatus comprises an illumination apparatus, a projection system, and a metrology system. The metrology system includes an illumination system, an optical system, a shutter system, an objective system and a detector. The illumination system is configured to generate an illumination beam. The optical system is configured to split the illumination beam into a first sub-beam and a second sub-beam. The shutter system is configured to control a transmittance of the first sub-beam and the second sub-beam independently. The objective system is configured to receive the first sub-beam and the second beam from the optical system and direct the first sub-beam and the second sub-beam towards a substrate having a target structure. The detector is configured to receive an image or a diffracted image of the target structure.

Further features of the present disclosure, as well as the structure and operation of various embodiments, are described in detail below with reference to the accompanying drawings. It is noted that the present disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present disclosure and, together with the description, further serve to explain the principles of the present disclosure and to enable a person skilled in the relevant art(s) to make and use embodiments described herein.

Figure 1A:
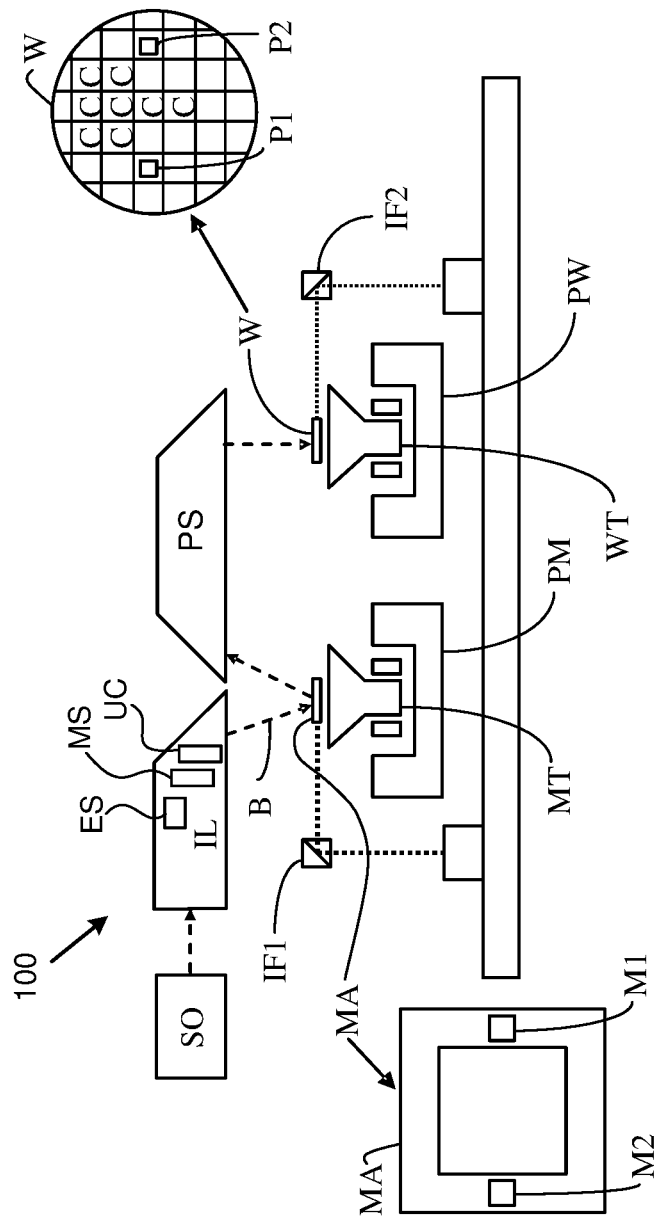
FIG. 1A shows a schematic of a reflective lithographic apparatus, according to some embodiments.

The features of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in

DETAILED DESCRIPTION

This specification discloses one or more embodiments that incorporate the features of the present disclosure. The disclosed embodiment(s) are provided as examples. The scope of the present disclosure is not limited to the disclosed embodiment(s). Claimed features are defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure can be implemented in hardware, firmware, software, or any combination thereof. Embodiments of the disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, instructions, etc. The term "non-transitory" may be used herein to characterize computer readable media used for storing data, information, instructions, and the like, with the sole exception being a transitory, propagating signal.

Before describing such embodiments in more detail, however, it is instructive to present an example environment in which embodiments of the present disclosure can be implemented.

Example Lithographic Systems

Figure 1B:
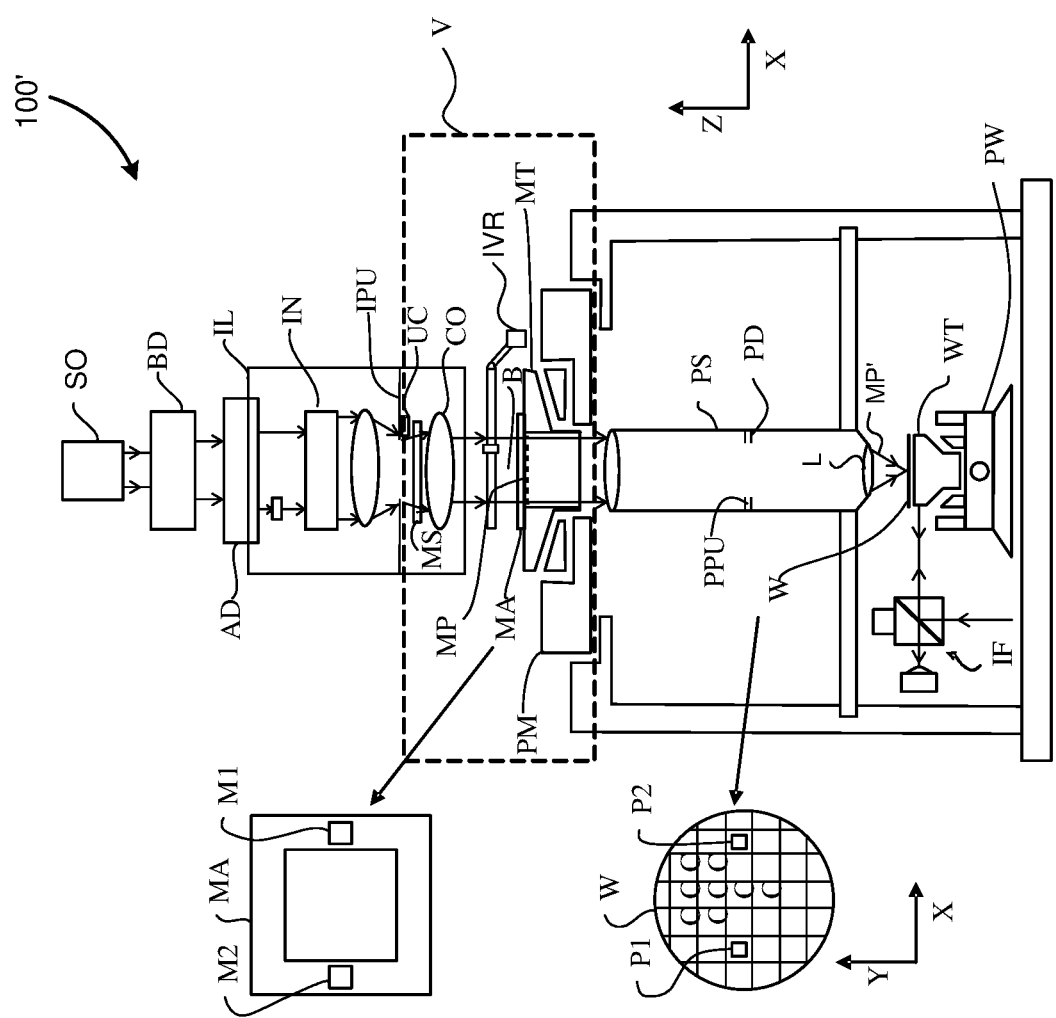
FIG. 1B shows a schematic of a transmissive lithographic apparatus, according to some embodiments.

FIGS. 1A and 1B show schematic illustrations of a lithographic apparatus 100 and lithographic apparatus 100', respectively, in which embodiments of the present disclosure may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT may be a frame or a table, for example, which may be fixed or movable, as required. By using sensors, the support structure MT may ensure that the patterning device MA is at a desired position, for example, with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which may be individually tilted so as to reflect an incoming radiation beam in different directions.

The tilted mirrors impart a pattern in the radiation beam B, which is reflected by a matrix of small mirrors.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables WT (and/or two or more mask tables). In such "multiple stage" machines, the additional substrate tables WT may be used in parallel, or preparatory steps may be carried out on one or more tables while one or more other substrate tables WT are being used for exposure. In some situations, the additional table may not be a substrate table WT.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' may be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO may be an integral part of the lithographic apparatus 100, 100', for example, when the source SO is a mercury lamp. The source SO and the illuminator IL, together with the beam delivery system BD, if required, may be referred to as a radiation system.

The illuminator IL may include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator may be adjusted. In addition, the illuminator IL may comprise various other components (in FIG. 1B), such as an integrator IN and a condenser CO. The illuminator IL may be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT may be moved accurately (for example, so as to position different target portions C in the path of the radiation beam B). Similarly, the first positioner PM and another position sensor IF1 may be used to accurately position the patterning device (for example, mask) MA with respect to the path of the radiation beam B. Patterning device (for example, mask) MA and substrate W may be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mark pattern MP by radiation from the intensity distribution, onto a photoresist layer coated on the substrate W. For example, the mask pattern MP may include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line may be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration may be reduced by providing radiation poles (not shown) in opposite quadrants of the illumination system pupil IPU. Further, in some embodiments, astigmatism aberration may be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT may be moved accurately (for example, so as to position different target portions C in the path of the radiation beam B). Similarly, the first positioner PM and another position sensor (not shown in FIG. 1B) may be used to accurately position the mask MA with respect to the path of the radiation beam B (for example, after mechanical retrieval from a mask library or during a scan).

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the mask table MT may be connected to a short-stroke actuator only or may be fixed. Mask MA and substrate W may be aligned using mask alignment marks M1, M2, and substrate alignment marks P1, P2. Although the substrate alignment marks (as illustrated) occupy dedicated target portions, they may be located in spaces between target portions (known as scribe-lane alignment marks). Similarly, in situations in which more than one die is provided on the mask MA, the mask alignment marks may be located between the dies.

Mask table MT and patterning device MA may be in a vacuum chamber V, where an in-vacuum robot IVR may be used to move patterning devices such as a mask in and out of vacuum chamber. Alternatively, when mask table MT and patterning device MA are outside of the vacuum chamber, an out-of-vacuum robot may be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' may be used in at least one of the following modes:
1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.
2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT may be determined by the (de-)magnification and image reversal characteristics of the projection system PS.
3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes a programmable patterning device, such as a programmable mirror array.

Combinations and/or variations on the described modes of use or entirely different modes of use may also be employed.

In some embodiments, a lithographic apparatus may generate DUV and/or EUV radiation. For example, lithographic apparatus 100' may be configured to operate using a DUV source. In another example, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
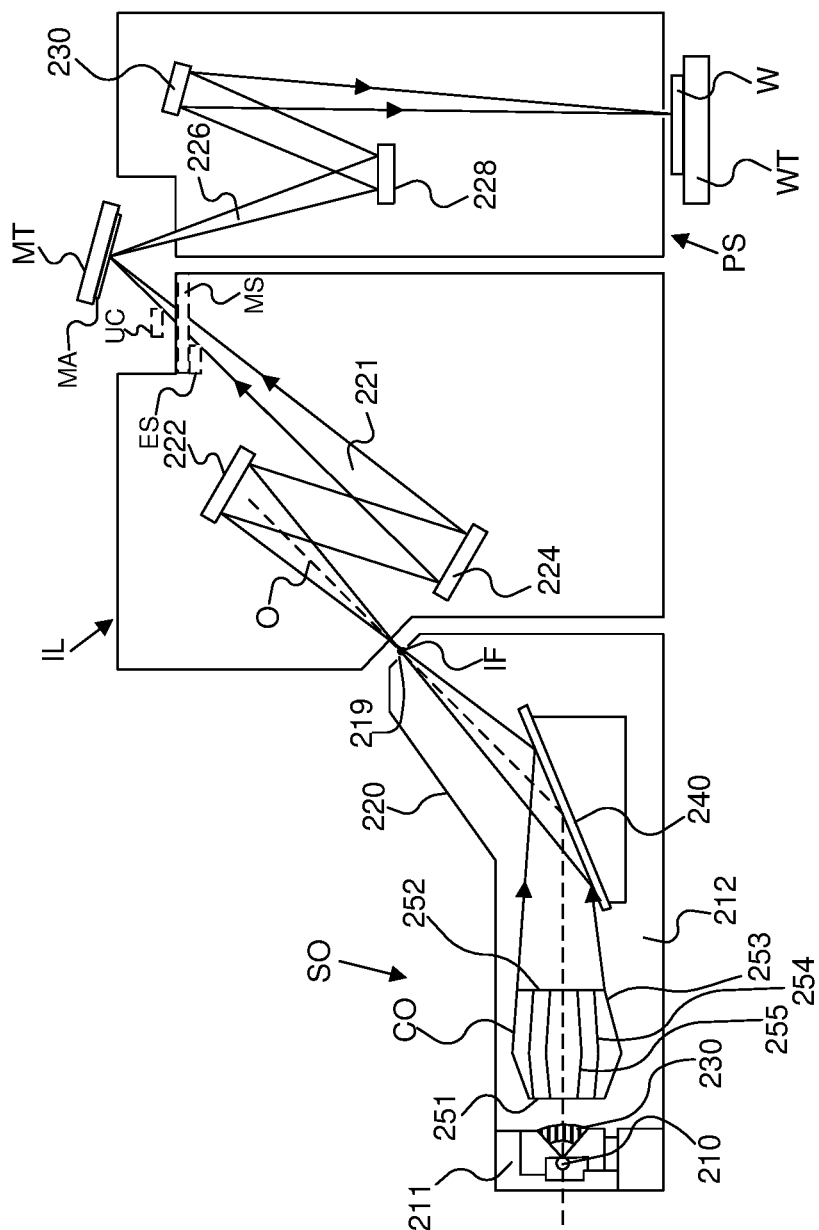
FIG. 2 shows a more detailed schematic of the reflective lithographic apparatus, according to some embodiments.

FIG. 2 shows the lithographic apparatus 100 in more detail, including the source collector apparatus SO, the illumination system IL, and the projection system PS. The source collector apparatus SO is constructed and arranged such that a vacuum environment may be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor may be required for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure.

The collector chamber 212 may include a radiation collector CO, which may be a so-called grazing incidence collector. Radiation collector CO has an upstream radiation collector side 251 and a downstream radiation collector side 252. Radiation that traverses collector CO may be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIG. 2, for example there may be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror).

The grazing incidence reflectors 253, 254, and 255 are disposed axially symmetric around an optical axis O and a collector optic CO of this type is preferably used in combination with a discharge produced plasma source, often called a DPP source.

Exemplary Lithographic Cell

Figure 3:
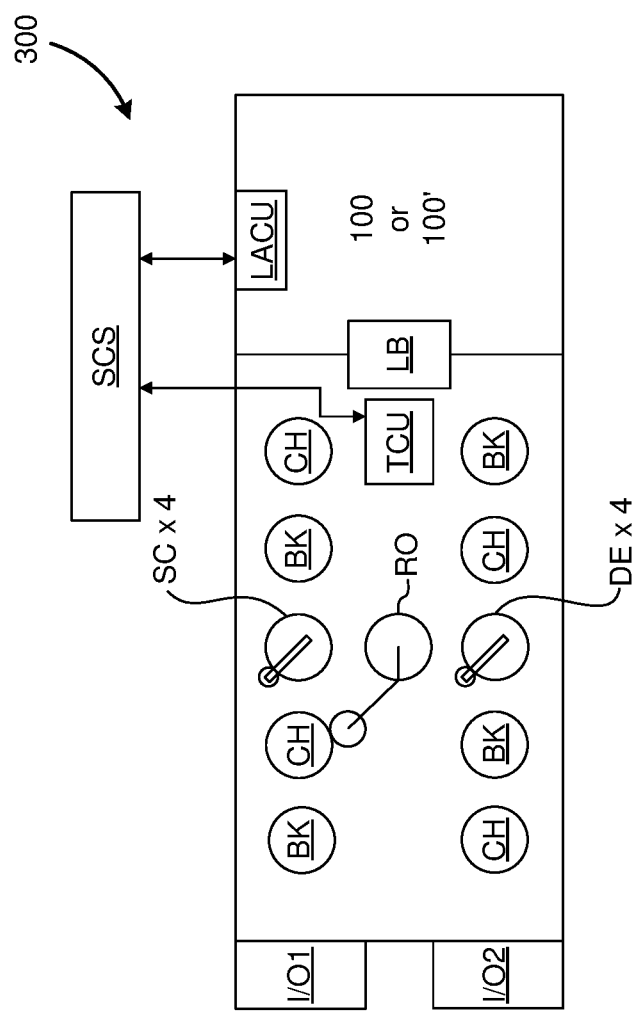
FIG. 3 shows a schematic of a lithographic cell, according to some embodiments.

FIG. 3 shows a lithographic cell 300, also sometimes referred to a lithocell or cluster, according to some embodiments. Lithographic apparatus 100 or 100' may form part of lithographic cell 300. Lithographic cell 300 may also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses may be operated to maximize throughput and processing efficiency.

Exemplary Metrology Apparatus

Figure 4A:
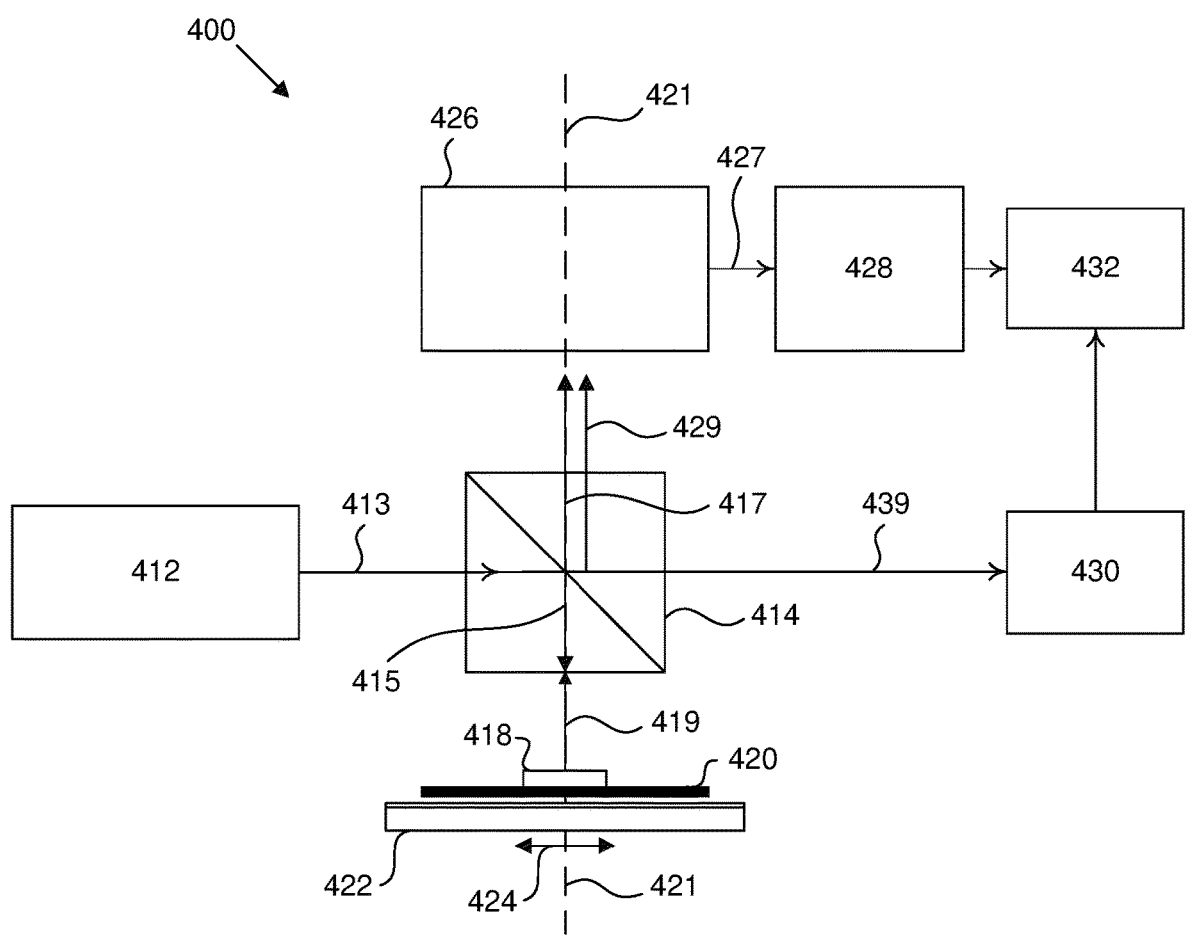
FIGS. 4A-4B show a schematic of a metrology system, according to some embodiments.

FIG. 4A shows a schematic of a cross-sectional view of an inspection apparatus 400 that can be implemented as a part of lithographic apparatus 100 or 100', according to some embodiments. In some embodiments, inspection apparatus 400 can be configured to align a substrate (e.g., substrate W) with respect to a patterning device (e.g., patterning device MA). Inspection apparatus 400 can be further configured to detect positions of alignment marks on the substrate and to align the substrate with respect to the patterning device or other components of lithographic apparatus 100 or 100' using the detected positions of the alignment marks. Such alignment of the substrate can ensure accurate exposure of one or more patterns on the substrate.

In some embodiments, inspection apparatus 400 can include an illumination system 412, a block 414, an interferometer 426, a detector 428, a beam analyzer 430, and an overlay calculation processor 432. Illumination system 412 can be configured to provide an electromagnetic narrow band radiation beam 413 having one or more passbands. In an example, the one or more passbands can be within a spectrum of wavelengths between about 500 nm to about 900 nm. In another example, the one or more passbands can be discrete narrow passbands within a spectrum of wavelengths between about 500 nm to about 900 nm. Illumination system 412 can be further configured to provide one or more passbands having substantially constant center wavelength (CWL) values over a long period of time (e.g., over a lifetime of illumination system 412). Such configuration of illumination system 412 can help to prevent the shift of the actual CWL values from the desired CWL values, as discussed above, in current alignment systems. And, as a result, the use of constant CWL values can improve long-term stability and accuracy of alignment systems (e.g., inspection apparatus 400) compared to the current alignment apparatuses.

In some embodiments, block 414 comprises optical elements/arrangements and can be configured to receive radiation beam 413 and split radiation beam 413 into at least two radiation sub-beams. For example, radiation beam 413 can be split into radiation sub-beams 415 and 417, as shown in FIG. 4A. Block 414 can be further configured to direct radiation sub-beam 415 onto a substrate 420 placed on a stage 422. In one example, the stage 422 is movable along direction 424. Radiation sub-beam 415 can be configured to illuminate an alignment mark or a target 418 located on substrate 420. Alignment mark or target 418 can be coated with a radiation sensitive film. In some embodiments, alignment mark or target 418 can have one hundred and eighty degrees (i.e., 180°) symmetry. That is, when alignment mark or target 418 is rotated 180° about an axis of symmetry perpendicular to a plane of alignment mark or target 418, rotated alignment mark or target 418 can be substantially identical to an unrotated alignment mark or target 418. The target 418 on substrate 420 can be (a) a resist layer grating comprising bars that are formed of solid resist lines, or (b) a product layer grating, or (c) a composite grating stack in an overlay target structure comprising a resist grating overlaid or interleaved on a product layer grating. The bars can alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. One in-line method used in device manufacturing for measurements of line width, pitch, and critical dimension makes use of a technique known as "scatterometry". Methods of scatterometry are described in Raymond et al., "Multiparameter Grating Metrology Using Optical Scatterometry", J. Vac. Sci. Tech. B, Vol. 15, no. 2, pp. 361-368 (1997) and Niu et al., "Specular Spectroscopic Scatterometry in DUV Lithography", SPIE, Vol. 3677 (1999), which are both incorporated by reference herein in their entireties. In scatterometry, light is reflected by periodic structures in the target, and the resulting reflection spectrum at a given angle is detected. The structure giving rise to the reflection spectrum is reconstructed, e.g. using Rigorous Coupled-Wave Analysis (RCWA) or by comparison to a library of patterns derived by simulation. Accordingly, the scatterometry data of the printed gratings is used to reconstruct the gratings. The parameters of the grating, such as line widths and shapes, can be input to the reconstruction process, performed by processing unit PU, from knowledge of the printing step and/or other scatterometry processes.

In some embodiments, block 414 and can be further configured to receive diffraction radiation beam 419 and split diffraction radiation beam 419 into at least two radiation sub-beams, according to an embodiment. Diffraction radiation beam 419 can be split into diffraction radiation sub-beams 429 and 439, as shown in FIG. 4A.

It should be noted that even though block 414 is shown to direct radiation sub-beam 415 towards alignment mark or target 418 and to direct diffracted radiation sub-beam 429 towards interferometer 426, the disclosure is not so limiting.

It would be apparent to a person skilled in the relevant art that other optical arrangements can be used to obtain the similar result of illuminating alignment mark or target 418 on substrate 420 and detecting an image of alignment mark or target 418.

As illustrated in FIG. 4A, interferometer 426 can be configured to receive radiation sub-beam 417 and diffracted radiation sub-beam 429 through block 414. In an example embodiment, diffracted radiation sub-beam 429 can be at least a portion of radiation sub-beam 415 that can be reflected from alignment mark or target 418. In an example of this embodiment, interferometer 426 comprises any appropriate set of optical-elements, for example, a combination of prisms that can be configured to form two images of alignment mark or target 418 based on the received diffracted radiation sub-beam 429. It should be appreciated that a good quality image need not be formed, but that the features of alignment mark 418 should be resolved. Interferometer 426 can be further configured to rotate one of the two images with respect to the other of the two images 180° and recombine the rotated and unrotated images interferometrically.

In some embodiments, detector 428 can be configured to receive the recombined image via interferometer signal 427 and detect interference as a result of the recombined image when alignment axis 421 of inspection apparatus 400 passes through a center of symmetry (not shown) of alignment mark or target 418. Such interference can be due to alignment mark or target 418 being 180° symmetrical, and the recombined image interfering constructively or destructively, according to an example embodiment. Based on the detected interference, detector 428 can be further configured to determine a position of the center of symmetry of alignment mark or target 418 and consequently, detect a position of substrate 420. According to an example, alignment axis 421 can be aligned with an optical beam perpendicular to substrate 420 and passing through a center of image rotation interferometer 426. Detector 428 can be further configured to estimate the positions of alignment mark or target 418 by implementing sensor characteristics and interacting with wafer mark process variations.

In a further embodiment, detector 428 determines the position of the center of symmetry of alignment mark or target 418 by performing one or more of the following measurements:

1. measuring position variations for various wavelengths (position shift between colors);
2. measuring position variations for various orders (position shift between diffraction orders); and
3. measuring position variations for various polarizations (position shift between polarizations).

This data can be obtained, for example, with any type of alignment sensor, for example a SMASH (SMart Alignment Sensor Hybrid) sensor, as described in U.S. Pat. No. 6,961,116 that employs a self-referencing interferometer with a single detector and four different wavelengths, and extracts the alignment signal in software, or Athena (Advanced Technology using High order ENhancement of Alignment), as described in U.S. Pat. No. 6,297,876, which directs each of seven diffraction orders to a dedicated detector, which are both incorporated by reference herein in their entireties.

In some embodiments, beam analyzer 430 can be configured to receive and determine an optical state of diffracted radiation sub-beam 439. The optical state can be a measure of beam wavelength, polarization, or beam profile. Beam analyzer 430 can be further configured to determine a position of stage 422 and correlate the position of stage 422 with the position of the center of symmetry of alignment mark or target 418. As such, the position of alignment mark or target 418 and, consequently, the position of substrate 420 can be accurately known with reference to stage 422. Alternatively, beam analyzer 430 can be configured to determine a position of inspection apparatus 400 or any other reference element such that the center of symmetry of alignment mark or target 418 can be known with reference to inspection apparatus 400 or any other reference element. Beam analyzer 430 can be a point or an imaging polarimeter with some form of wavelength-band selectivity. In some embodiments, beam analyzer 430 can be directly integrated into inspection apparatus 400, or connected via fiber optics of several types: polarization preserving single mode, multimode, or imaging, according to other embodiments.

In some embodiments, beam analyzer 430 can be further configured to determine the overlay data between two patterns on substrate 420. One of these patterns can be a reference pattern on a reference layer. The other pattern can be an exposed pattern on an exposed layer. The reference layer can be an etched layer already present on substrate 420. The reference layer can be generated by a reference pattern exposed on the substrate by lithographic apparatus 100 and/or 100'. The exposed layer can be a resist layer exposed adjacent to the reference layer. The exposed layer can be generated by an exposure pattern exposed on substrate 420 by lithographic apparatus 100 or 100'. The exposed pattern on substrate 420 can correspond to a movement of substrate 420 by stage 422. In some embodiments, the measured overlay data can also indicate an offset between the reference pattern and the exposure pattern. The measured overlay data can be used as calibration data to calibrate the exposure pattern exposed by lithographic apparatus 100 or 100', such that after the calibration, the offset between the exposed layer and the reference layer can be minimized.

In some embodiments, beam analyzer 430 can be further configured to determine a model of the product stack profile of substrate 420, and can be configured to measure overlay, critical dimension, and focus of target 418 in a single measurement. The product stack profile contains information on the stacked product such as alignment mark, target 418, or substrate 420, and can include mark process variation-induced optical signature metrology that is a function of illumination variation. The product stack profile can also include product grating profile, mark stack profile, and mark asymmetry information. An example of beam analyzer 430 is Yieldstar™, manufactured by ASML, Veldhoven, The Netherlands, as described in U.S. Pat. No. 8,706,442, which is incorporated by reference herein in its entirety. Beam analyzer 430 can be further configured to process information related to a particular property of an exposed pattern in that layer. For example, beam analyzer 430 can process an overlay parameter (an indication of the positioning accuracy of the layer with respect to a previous layer on the substrate or the positioning accuracy of the first layer with respective to marks on the substrate), a focus parameter, and/or a critical dimension parameter (e.g., line width and its variations) of the depicted image in the layer. Other parameters are image parameters relating to the quality of the depicted image of the exposed pattern.

In some embodiments, an array of detectors (not shown) can be connected to beam analyzer 430, and allows the possibility of accurate stack profile detection as discussed below. For example, detector 428 can be an array of detectors. For the detector array, a number of options are possible: a bundle of multimode fibers, discrete pin detectors per channel, or CCD or CMOS (linear) arrays. The use of a bundle of multimode fibers enables any dissipating elements to be remotely located for stability reasons. Discrete PIN detectors offer a large dynamic range but each need separate pre-amps. The number of elements is therefore limited. CCD linear arrays offer many elements that can be read-out at high speed and are especially of interest if phase-stepping detection is used.

Figure 4B:
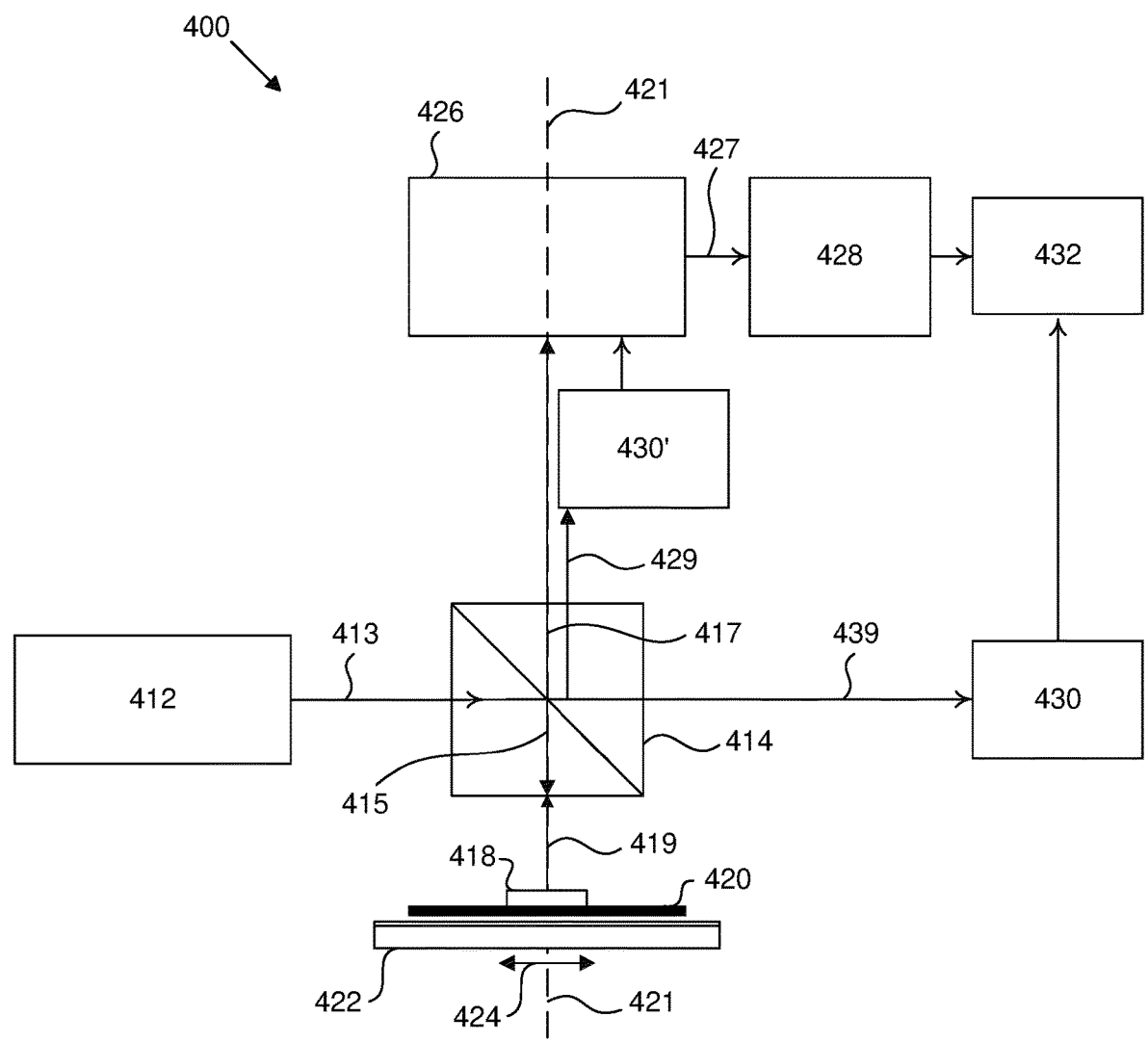

In some embodiments, a second beam analyzer 430' can be configured to receive and determine an optical state of diffracted radiation sub-beam 429, as shown in FIG. 4B. The optical state can be a measure of beam wavelength, polarization, or beam profile. Second beam analyzer 430' can be identical to beam analyzer 430. Alternatively, second beam analyzer 430' can be configured to perform at least all the functions of beam analyzer 430, such as determining a position of stage 422 and correlating the position of stage 422 with the position of the center of symmetry of alignment mark or target 418. As such, the position of alignment mark or target 418 and, consequently, the position of substrate 420, can be accurately known with reference to stage 422. Second beam analyzer 430' can also be configured to determine a position of inspection apparatus 400, or any other reference element, such that the center of symmetry of alignment mark or target 418 can be known with reference to inspection apparatus 400, or any other reference element. Second beam analyzer 430' can be further configured to determine the overlay data between two patterns and a model of the product stack profile of substrate 420. Second beam analyzer 430' can also be configured to measure overlay, critical dimension, and focus of target 418 in a single measurement.

In some embodiments, second beam analyzer 430' can be directly integrated into inspection apparatus 400, or it can be connected via fiber optics of several types: polarization preserving single mode, multimode, or imaging, according to other embodiments. Alternatively, second beam analyzer 430' and beam analyzer 430 can be combined to form a single analyzer (not shown) configured to receive and determine the optical states of both diffracted radiation sub-beams 429 and 439.

In some embodiments, processor 432 receives information from detector 428 and beam analyzer 430. For example, processor 432 can be an overlay calculation processor. The information can comprise a model of the product stack profile constructed by beam analyzer 430. Alternatively, processor 432 can construct a model of the product mark profile using the received information about the product mark. In either case, processor 432 constructs a model of the stacked product and overlay mark profile using or incorporating a model of the product mark profile. The stack model is then used to determine the overlay offset and minimizes the spectral effect on the overlay offset measurement. Processor 432 can create a basic correction algorithm based on the information received from detector 428 and beam analyzer 430, including but not limited to the optical state of the illumination beam, the alignment signals, associated position estimates, and the optical state in the pupil, image, and additional planes. The pupil plane is the plane in which the radial position of radiation defines the angle of incidence and the angular position defines the azimuth angle of the radiation. Processor 432 can utilize the basic correction algorithm to characterize the inspection apparatus 400 with reference to wafer marks and/or alignment marks 418.

In some embodiments, processor 432 can be further configured to determine printed pattern position offset error with respect to the sensor estimate for each mark based on the information received from detector 428 and beam analyzer 430. The information includes but is not limited to the product stack profile, measurements of overlay, critical dimension, and focus of each alignment marks or target 418 on substrate 420. Processor 432 can utilize a clustering algorithm to group the marks into sets of similar constant offset error, and create an alignment error offset correction table based on the information. The clustering algorithm can be based on overlay measurement, the position estimates, and additional optical stack process information associated with each set of offset errors. The overlay is calculated for a number of different marks, for example, overlay targets having a positive and a negative bias around a programmed overlay offset. The target that measures the smallest overlay is taken as reference (as it is measured with the best accuracy). From this measured small overlay, and the known programmed overlay of its corresponding target, the overlay error can be deduced. Table 1 illustrates how this can be performed. The smallest measured overlay in the example shown is −1 nm. However this is in relation to a target with a programmed overlay of −30 nm. Consequently the process must have introduced an overlay error of 29 nm.

TABLE 1

| Programmed overlay | −70 | −50 | −30 | −10 | 10 | 30 | 50 |
|---|---|---|---|---|---|---|---|
| Measured overlay | −38 | −19 | −1 | 21 | 43 | 66 | 90 |
| Difference between measured and programmed overlay | 32 | 31 | 29 | 31 | 33 | 36 | 40 |
| Overlay error | 3 | 2 | — | 2 | 4 | 7 | 11 |

The smallest value can be taken to be the reference point and, relative to this, the offset can be calculated between measured overlay and that expected due to the programmed overlay. This offset determines the overlay error for each mark or the sets of marks with similar offsets. Therefore, in the Table 1 example, the smallest measured overlay was −1 nm, at the target position with programmed overlay of 30 nm. The difference between the expected and measured overlay at the other targets is compared to this reference. A table such as Table 1 can also be obtained from marks and target 418 under different illumination settings, the illumination setting, which results in the smallest overlay error, and its corresponding calibration factor, can be determined and selected. Following this, processor 432 can group marks into sets of similar overlay error. The criteria for grouping marks can be adjusted based on different process controls, for example, different error tolerances for different processes.

In some embodiments, processor 432 can confirm that all or most members of the group have similar offset errors, and apply an individual offset correction from the clustering algorithm to each mark, based on its additional optical stack metrology. Processor 432 can determine corrections for each mark and feed the corrections back to lithographic apparatus 100 or 100' for correcting errors in the overlay, for example, by feeding corrections into the inspection apparatus 400.

Exemplary Illumination System

In one implementation, illumination system 412 can use two illumination fibers. A first illumination fiber can emit a beam that travels through a polarizing beam splitter cube in transmission, resulting in P polarized light relative to the hypotenuse in the prism. The second illumination fiber can generate a beam that travels through the same polarizing beam splitter in reflection, resulting in a beam containing S polarized light which is co-axial with the P polarized beam.

In some aspects, the illumination system is capable of illuminating the wafer with light of H polarization, V polarization, H and V polarization, and neither polarization (no light). In some aspects, these different illumination conditions are selected by turning these two fibers "on" or "off" as needed, using a shuttering system upstream of the fiber tip, remote from the substrate 420.

In some aspects, selecting polarizations in this way calls for combining the two polarized beam paths prior to the majority of the optics in the metrology system. For example, this can be because the later the two paths are combined the more complicated the sensor becomes due to the inclusion of two copies of the illumination optical design up to that point. In other aspects, optically it would be desired to have the polarizing optic as late in the illumination path as possible (as close to the wafer as possible). For example, this can be because after the polarization state has been set, passing through additional optics can degrade the purity of the polarization state, which can negatively impact the performance of the sensor. In some aspects, a parameter for sensor performance is polarization purity of the light hitting the wafer from the illumination system.

In some embodiments, metrology system 500 can also represent a more detailed view of inspection apparatus 400 (FIGS. 4A and 4B). For example, FIG. 5 illustrates a more detailed view of illumination system 412 and its functions.

Figure 5:
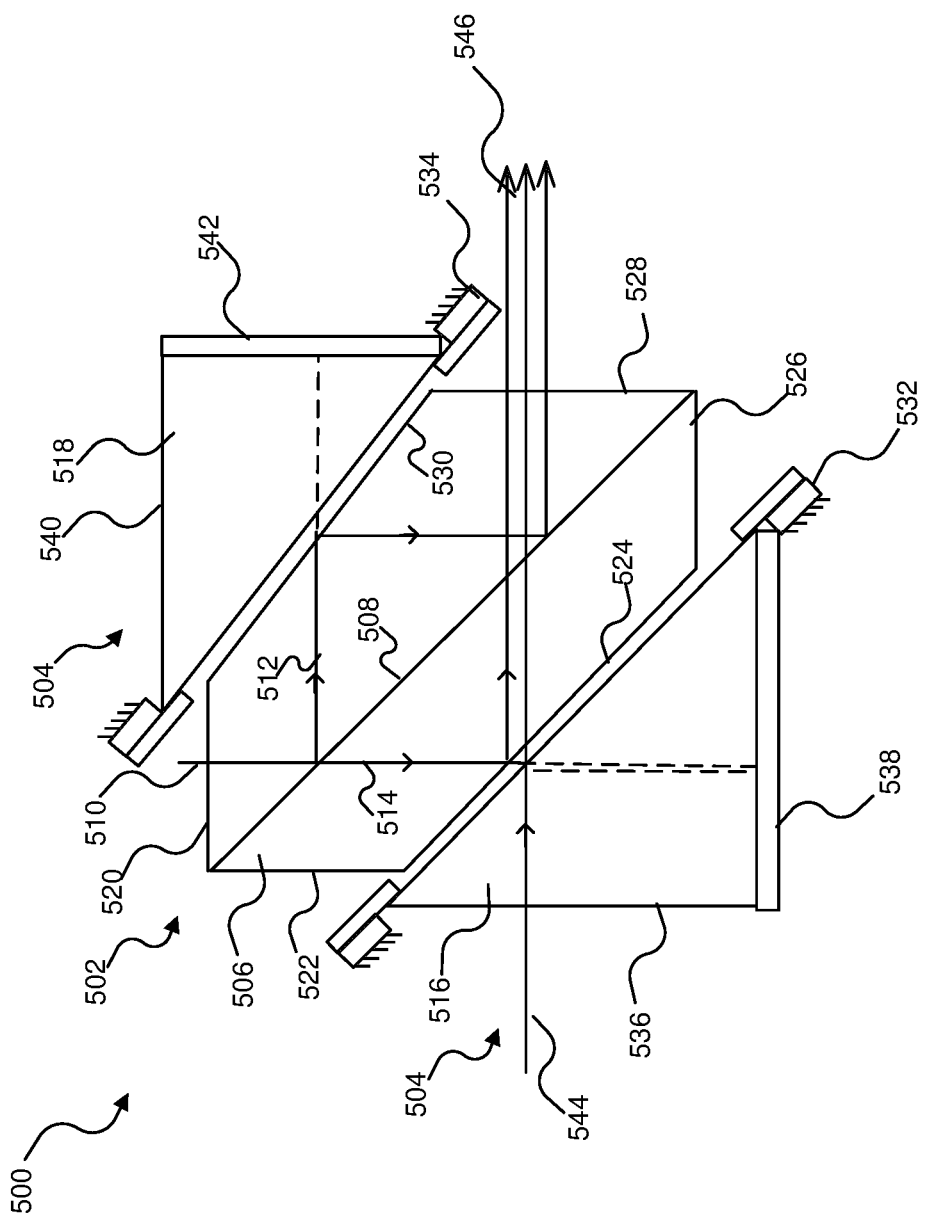
FIG. 5 shows an optical system for the metrology system, according to some embodiments.

FIG. 5 shows an optical system 500 for a metrology system, according to some embodiments. Optical system 500 can include an optical system 502, e.g., a polarizing prism assembly, and a shutter system 504. Optical system 500 can allow polarizations of illuminating beams to be selected closer to the wafer in the illumination path.

In one embodiment, optical system 502 includes one or two prisms which split a single input beam into its polarization components. In one embodiment, illumination beam 510 can include unpolarized radiation beams as inputs to optical system 502. Optical system 502 can split input beam 510 into their horizontal (H) and vertical (V) polarization components. For example, optical system 502 can split input beam 510 into a first sub-beam 512 and a second sub-beam 514.

In some aspects, optical system 502 subsequently re-combines the individual polarized beams. First sub-beam 512 and second sub-beam 514 can be recombined into output beam 546. While the two polarization components of the input beam (i.e., first sub-beam 512 and second sub-beam 514) are separated, shutter system 504 can block each of the polarizations independently. Shutter system 504 can include a set of "shutters" or similar devices as described later herein.

In one embodiment, optical system 502 can include a prism 506. Prism 506 can include a polarizing beam splitter surface (PBS) 508. For example, PBS 508 can reflect s-polarization radiation to form first sub-beam 512 and transmits p-polarization to form second sub-beam 514. Prism 506 can include optical surface 520, 522, 524, 526, 528, 530.

In one embodiment, input surface 520 can include an anti-reflective (AR) coating for radiation beams at a wavelength range of, e.g., about 410 nm to about 900 nm. Surfaces 522, 524, 526, 528, 530 of prism 506 can be uncoated surfaces. According to some examples, an angle between surfaces 520 and 522 is about 90°. In some examples, an angle between surfaces 526 and 528 is about Surface 524 and surface 530 may be parallel to each other. It is noted that the embodiments of this disclosure are not limited to these examples and other coating, optical devices, and angles can be used for surfaces of prism 506. For example, surface 524 and surface 530 may be TIR surfaces.

In one embodiment, the shutter system 504 may include a set of frustrated TIR switches 516, 518. Each frustrated TIR switch may include an optical element mounted on piezo actuators to optionally create FTIR conditions at the prism surface. For example, TIR switch 516 may include optical element 536, piezo actuators 532, and dump 538. TIR switch 518 may also include optical element 540, piezo actuators 534, and dump 542. Thus, the optical system may shutter either of first and second sub-beams 512, 514. Optical elements 536, 540 may be a shaped glass mounted on piezo actuators. In some aspects, piezo actuators are configured to position optical elements 536, 540 very close to the TIR surfaces 524, 530, respectively of the optical system 502 in order to "frustrate" the TIR at that surface. For example, optical element 536 is positioned close to first TIR surface 524, and optical element 540 is positioned close to second TIR surface 530.

In some aspects, when the TIR is "frustrated," light passes through the TIR surface 530 into the optical element 540 instead of reflecting off the TIR surface 530. For example, first sub-beam 512 passes through optical element 540 into dump 542 instead of reflecting off TIR surface 530. Similarly, e.g., second sub-beam 514 passes through optical element 536 into dump 538 instead of reflecting off TIR surface 524.

In some aspects, the frustrated TIRs 524, 530 serve as the "shuttered" condition for each channel. For example, first sub-beam 512 and second sub-beam 514 pass through when the TIR are not frustrated. And, e.g., first sub-beam 512 and second sub-beam 514 do not pass through when TIR surface 530, 524 are "frustrated", respectively.

In some aspects, to achieve frustrated TIR optical element 536, 540 are positioned closer than a single wavelength of the illumination beam across the entire pair of the TIR surfaces 524, 530. In some aspects, in order to allow light to reflect off the surfaces 524, 530, piezo actuators 532, 534 are used to increase the gap between the two pieces of glass to the point that frustrated TIR can no longer occur. The reason this may be fast enough is due to the fast move speed of piezo actuators and the very small distance that would need to be traversed to go between the frustrated TIR and standard TIR conditions.

A focus beam 544 may be used, for example, to measure the intensity of the incident radiation. The focus beam may have a different entry to the system. For example, focus beam 544 may enter optical system 500 via optical element 536. In one embodiment, when the TIR is "frustrated" (i.e., p-channel is off), the focus beam 544 goes through prism 506 and exist the system via surface 528.

In one embodiment, optical system 500 provides the benefit that switching a channel off can allow a beam of opposite polarization to pass through to the substrate 420 (FIG. 4A) from a different entry point to the prism assembly.

In some aspects, the switching devices (e.g., the set of frustrated TIR switches 516, 518) described herein are able to switch on and off within a time on a scale of single digit milliseconds.

Figure 6:
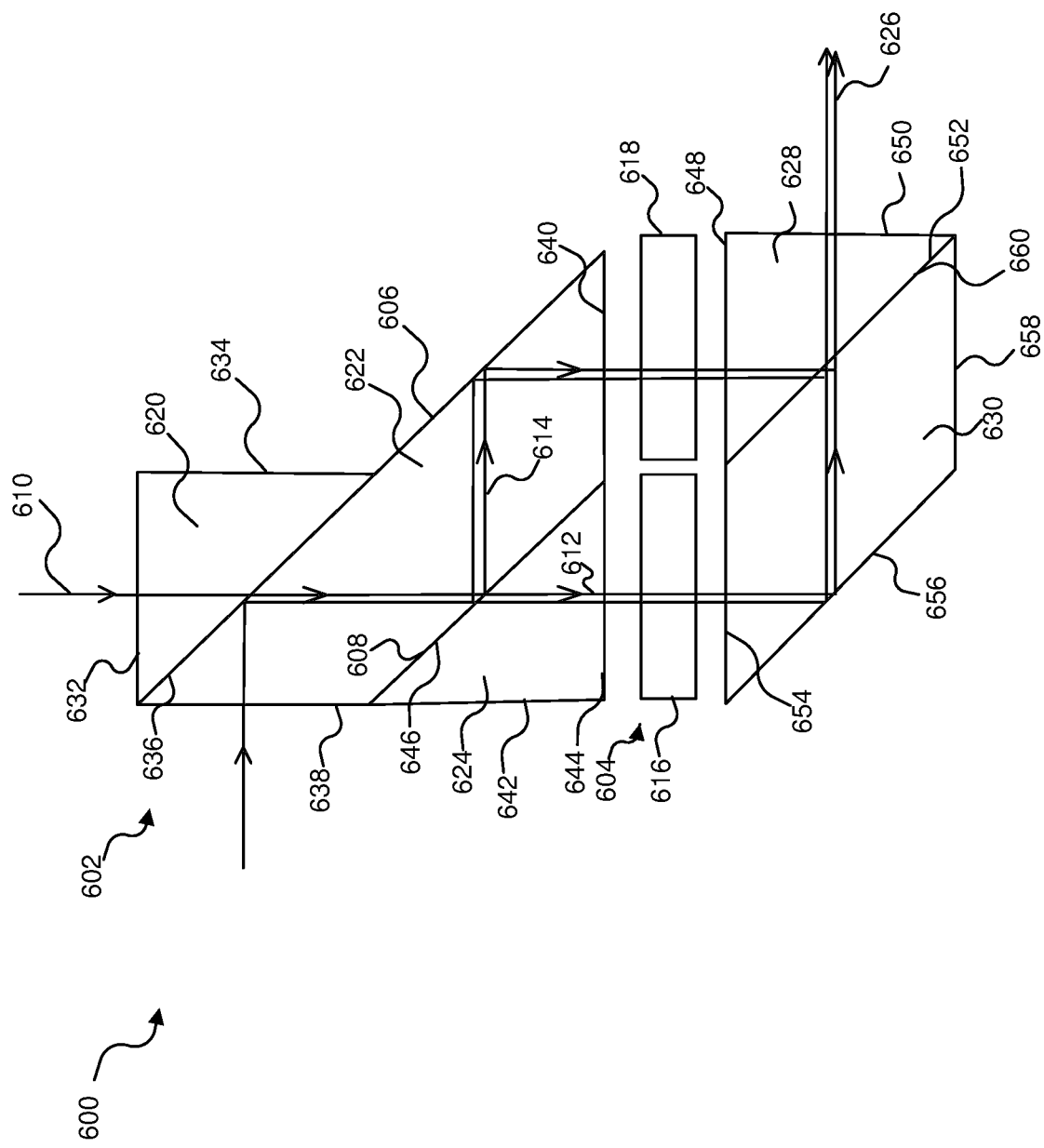
FIG. 6 shows an optical system for the metrology system, according to some embodiments.

FIG. 6 shows an optical system 600 for a metrology system, according to some embodiments. In one embodiment, the optical system 600 may include a beam splitting optical system 602 and a shutter system 604. Shutter system 604 can include a first optical element 616 and a second optical element 618. First optical element 616 and second optical element 618 may include electro-optical components. For example, a set of adjustable fast axis LCD waveplates can accomplish the switching by rotating the polarization in either of the polarized sub-beams generated by the polarization switching assembly (e.g., first optical element 616, second optical element 618) to the opposite polarization. In one example, rotating the polarization cause the sub-beam 614 to travel out a channel of the re-combining beam splitter (i.e., optical elements 628, 630) that doesn't lead to the wafer (e.g., substrate 420 of FIG. 4A), instead of the one that does.

In one embodiment, the optical system 602 may include a TIR surface 606 and a polarizing beam splitter (PBS) 608. An illumination beam 610 can be split into a first sub-beam 612 and a second sub-beam 614 after passing through PBS 608. First sub-beam 612 and second sub-beam 614 corresponds to the horizontal (H) and vertical (V) polarization components of input beam 610. First sub-beam 612 may pass through first optical element 616 and second sub-beam 614 may pass through a second shutter 618.

In one embodiment, the illumination beam 610 is split using optical elements 620, 622, 624. First sub-beam 612 and second sub-beam 614 may be recombined into output beam 626 using optical elements 628, 630. In some aspects, first sub-beam 612 and second sub-beam 614 travel substantially the same optical paths through the system.

Optical element 620 can include surfaces 632, 634, 636. In one embodiment, input surface 632 can include an anti-reflective (AR) coating for radiation beams at a wavelength range of about 410 nm to about 900 nm. Surface 634 of optical element 620 can include an uncoated surface. According to some examples, an angle between surfaces 632 and 634 is about 90°. And, e.g., an angle between surface 632 and 636 is about 45°. An angle between surface 634 and surface 636 can be about 45°. It is noted that the embodiments of this disclosure are not limited to these examples and other coating, optical devices, and angles can be used for surfaces of optical element 620.

Optical element 624 can include TIR surface 606, PBS 608, and surfaces 638, 640. According to some examples, surfaces 606, 608 may be parallel to each other.

Surface 636 of optical element 620 may be coupled to surface 606 of optical element 622 using, for example, an adhesive (e.g., an optical cement).

TIR surface 606 may be uncoated surface used for total internal reflection of second sub-beam 614. However, TIR surface 606 can include other optical devices and/or material, such as a reflecting coating, to reflect sub-beam 614. Reflected sub beam can exit optical element 622 through output surface 640.

Optical element 624 can include surfaces 642, 644, 646. According to some examples, an angle between surfaces 642 and 644 is about 90°. And, e.g., an angle between surface 642 and 646 is about 45°. An angle between surface 644 and surface 646 can be about 45°. It is noted that the embodiments of this disclosure are not limited to these examples and other coating, optical devices, and angles can be used for surfaces of optical element 624. Surface 646 of optical element 624 may be coupled to surface 608 of optical element 622 using, for example, an adhesive. First sub-beam can exit optical element 624 through output surface 644.

Optical element 628 can include surfaces 648, 650, 652. Surface 652 can be a TIR surface configured to reflect second sub-beam 618. According to some examples, an angle between surfaces 648 and 650 is about 90°. And, e.g., an angle between surface 650 and 652 is about 45°. An angle between surface 648 and surface 652 can be about 45°. The second sub-beam 614 can enter optical element 628 via surface 648 and exit optical element 628 via surface 650 after recombining with first sub-beam 612.

Optical element 630 can include surfaces 654, 656, 658, 660. Surface 656 may be a TIR surface configured to reflect first sub-beam 612. First sub-beam 612 may enter optical element 630 via surface 654. First sub-beam 612 reflects at surface 656.

In one embodiment, shutters 616 and 618 can be implemented using electromechanical shutters. For example, shutters 616 and 618 may be bistable solenoid switches. The switching speed of the bistable solenoid switches can be configured based on torque curves and the switching speed requirements.

In some aspects, the approaches described herein can provide a much higher illumination beam polarization extinction ratio (i.e., polarization purity metric) at the wafer. In some aspects, the approaches described herein can simplify the "Upper Illumination Assembly" (UIA) of the Yieldstar™ which contains the first few optics in the illumination beam path. Selecting polarizations later in the beam path may allow the removal of the polarizing beam splitter currently used for polarization setting in the UIA, a collimating lens which is a duplicate of another (there is one for each fiber/channel), one of the fibers, and one set of apertures in the spot size selector.

Figure 7:
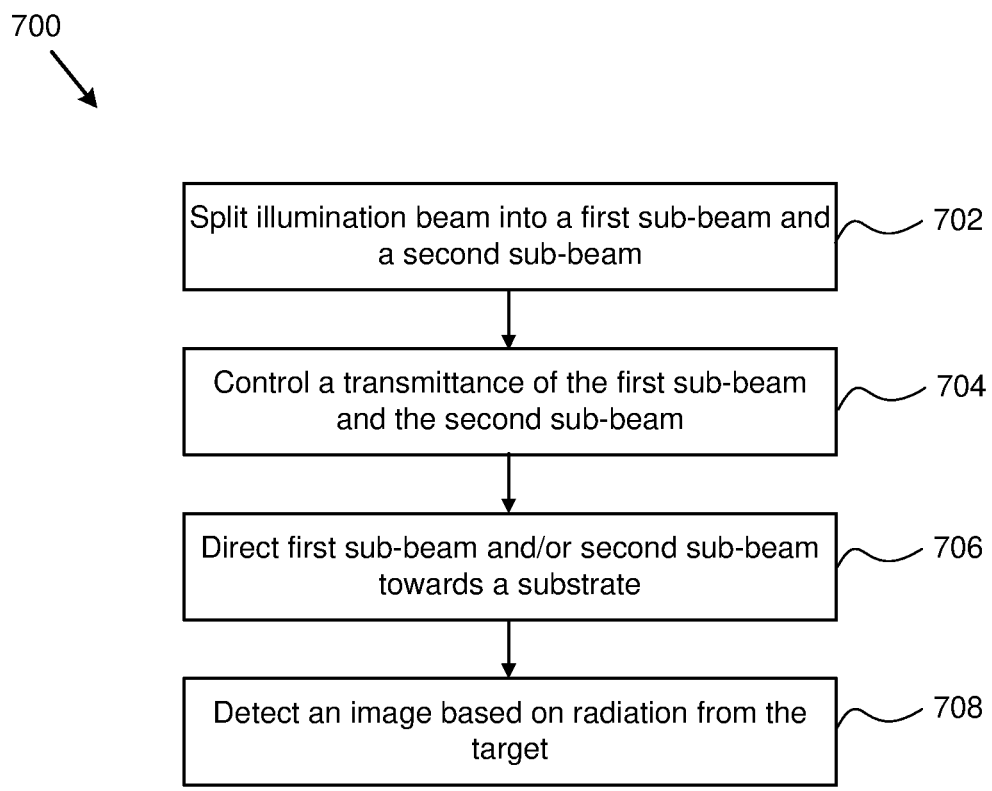
FIG. 7 illustrates a flowchart for operations performed by a metrology system, according to some embodiments.

FIG. 7 illustrates a flowchart 700 depicting an exemplary operation of a metrology system, according to an embodiment. Solely for illustrative purposes, the steps illustrated in FIG. 7 will be described with reference to example operating environments illustrated in FIGS. 5 and 6. However, flowchart 700 is not limited to these embodiments. It is to be appreciated that steps can be performed in a different order or not performed depending on specific applications.

In step 702, an illumination beam is split into a first sub-beam and a second sub-beam. As described above, splitting may be accomplished by a polarization beam splitter such as polarizing prism assembly 502.

In step 704, first sub-beam and second sub-beam are passed via a shutter system that controls a transmittance of the first sub-beam or the second sub-beam independently. In other words, the shutter system may pass the first sub-beam and the second sub-beam, block either the first sub-beam or the second sub-beam, or block both of the first sub-beam and the second sub-beam.

In step 706, an objective projection system receives the first sub-beam and/or the second sub-beam and directs the first sub-beam and/or the second sub-beam towards a substrate having a target structure.

In step 708, a detector detects an image or diffracted image of the target structure based on radiation from the target. For example, the radiation may be a diffracted image.

The embodiments may further be described using the following clauses:

1. A system comprising:
    an illumination system configured to generate an illumination beam;
    an optical system configured to split the illumination beam into a first sub-beam and a second sub-beam;
    a shutter system configured to independently control a transmittance of the first sub-beam and the second sub-beam;
    an objective system configured to receive the first sub-beam and the second beam from the optical system and direct the first sub-beam and the second sub-beam towards a substrate having a target structure; and
    a detector configured to receive an image or a diffracted image of the target structure.

2. The system of clause 1, wherein the first sub-beam and the second sub-beam are recombined after the first and second sub-beams have passed through the shutter system.

3. The system of clause 1, wherein the optical system is a prism system, and the prism system comprises a first total internal reflection (TIR) surface, a second TIR surface, and a polarizing beam splitter (PBS).

4. The system of clause 3, wherein the shutter system comprises:
a first optical element and a second optical element configured to frustrate the first TIR surface and/or the second TIR surface system, the first optical element being positioned near the first TIR surface and the second optical element being positioned near the second TIR surface.

5. The system of clause 4, wherein the first optical element and the second optical element are controlled via piezo actuators to control a first distance between the first optical element and the first TIR surface and a second distance between the second optical element and the second TIR surface.

6. The system of clause 5, further comprising:
a controller configured to control the piezo actuators to frustrate the first TIR surface and/or the second TIR surface.

7. The system of clause 1, wherein the shutter system is further configured to rotate a polarization of either the first sub-beam and/or the second sub-beam.

8. The system of clause 1, wherein the shutter system comprises an electro-optical element.

9. The system of clause 8, wherein the electro-optical element comprises a liquid crystal waveplate.

10. The system of clause 1, wherein the shutter system comprises an electro-mechanical shutter.

11. The system of clause 10, wherein the electro-mechanical shutter comprises a bistable solenoid switch.

12. A method comprising:
splitting, via an optical system, an illumination beam into a first sub-beam and a second sub-beam;
independently controlling, via a shutter system, a transmittance of the first sub-beam or the second sub-beam;
directing, via an objective projection system, a portion of the transmitted first sub-beam and the second sub-beam towards a substrate having a target structure; and
detecting an image or diffracted image of the target structure.

13. The method of clause 12, further comprising:
recombining the first sub-beam and the second sub-beam after the first and second sub-beams have passed through the shutter system.

14. The method of clause 12, further comprising:
using a prism system as the optical system, the prism system comprising a first total internal reflection (TIR) surface, a second TIR surface, and a polarizing beam splitter (PBS).

15. The method of clause 14, further comprising:
frustrating the first TIR surface using a first optical element positioned near the first TIR surface; and/or
frustrating the second TIR surface using a second optical element positioned near the second TIR surface.

16. The method of clause 15, further comprising:
controlling, via first and second respective piezo actuators, a first distance between the first optical element and a second distance between the first TIR surface and the second optical element and the second TIR surface.

17. The method of clause 12, further comprising:
rotating a polarization of either the first sub-beam or the second sub-beam.

18. The method of clause 16, further comprising:
using an electro-optical element for the shutter system.

19. A lithography apparatus comprising:
an illumination apparatus configured to illuminate a pattern of a patterning device;
a projection system configured to project an image of the pattern onto a substrate; and
a metrology system comprising:
an illumination system configured to generate an illumination beam,
an optical system configured to split the illumination beam into a first sub-beam and a second sub-beam,
a shutter system configured to independently control a transmittance of the first sub-beam and the second sub-beam,
an objective system configured to receive the first sub-beam and the second beam from the optical system and direct the first sub-beam and the second sub-beam towards the substrate having a target structure corresponding to the pattern, and
a detector configured to receive an image or a diffracted image of the target structure.

20. The lithography apparatus of clause 19, wherein the optical system is a prism system, and the prism system comprises a first total internal reflection (TIR) surface, a second TIR surface, and a polarizing beam splitter (PBS).

In some embodiments, metrology systems described herein may be implemented in a larger system, for example, within a lithographic apparatus.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the present disclosure in the context of optical lithography, it will be appreciated that the present disclosure can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The term "substrate" as used herein describes a material onto which material layers are added. In some embodiments, the substrate itself can be patterned and materials added on top of it may also be patterned, or may remain without patterning.

Although specific reference can be made in this text to the use of the apparatus and/or system according to the present disclosure in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the present disclosure have been described above, it will be appreciated that the present disclosure can be practiced otherwise than as described. The description is not intended to limit the present disclosure.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of protected subject matter should not be limited by any of the above-described exemplary embodiments, but should be defined only in accordance with the following claims and their equivalents.

The invention claimed is:

1. A system comprising:
   an illumination system configured to generate an illumination beam;
   an optical system configured to split the illumination beam into a first sub-beam and a second sub-beam,
      wherein the optical system comprises a prism system comprising a first frustrated total internal reflection (FTIR) switch surface, a second FTIR switch surface, and a polarizing beam splitter (PBS), and
      wherein the first and the second FTIR switch surfaces are disposed in parallel on opposite sides on the PBS;
   a shutter system configured to independently control a transmittance of the first sub-beam and the second sub-beam, wherein the first sub-beam and the second sub-beam are recombined after the first and second sub-beams have passed through the shutter system;
   an objective system configured to receive the recombined first and second sub-beams from the optical system and to direct the recombined first and second sub-beams towards a substrate having a target structure; and
   a detector configured to receive an image or a diffracted image of the target structure.

2. The system of claim 1, wherein the shutter system comprises:
   a first optical element and a second optical element configured to frustrate the first FTIR switch surface and/or the second FTIR switch surface, the first optical element being positioned near the first FTIR switch surface and the second optical element being positioned near the second FTIR switch surface.

3. The system of claim 2, wherein the first optical element and the second optical element are controlled via piezo actuators to control a first distance between the first optical element and the first FTIR switch surface and a second distance between the second optical element and the second FTIR switch surface.

4. The system of claim 3, further comprising:
   a controller configured to control the piezo actuators to frustrate the first FTIR switch surface and/or the second FTIR switch surface.

5. The system of claim 1, wherein the shutter system is further configured to rotate a polarization of either the first sub-beam and/or the second sub-beam.

6. The system of claim 1, wherein the shutter system comprises an electro-optical element.

7. The system of claim 6, wherein the electro-optical element comprises a liquid crystal waveplate.

8. The system of claim 1, wherein the shutter system comprises an electro-mechanical shutter.

9. The system of claim 8, wherein the electro-mechanical shutter comprises a bistable solenoid switch.

10. A lithography apparatus comprising:
    an illumination apparatus configured to illuminate a pattern of a patterning device;
    a projection system configured to project an image of the pattern onto a substrate; and
    a metrology system comprising the system of claim 1.

* * * * *